(12) United States Patent
Chuang

(10) Patent No.: US 7,420,830 B2
(45) Date of Patent: Sep. 2, 2008

(54) MEMORY CARD MODULE

(75) Inventor: Ping-Yang Chuang, 18F., No. 6, Lane 79, Sec. 2, Jianguo S. Rd., Taipei City (TW)

(73) Assignees: A-Data Technology Co., Ltd., Taipei (TW); Ping-Yang Chuang, Taipei (TW)

( * ) Notice: Subject to any disclaimer, the term of this patent is extended or adjusted under 35 U.S.C. 154(b) by 154 days.

(21) Appl. No.: 11/633,423

(22) Filed: Dec. 5, 2006

(65) Prior Publication Data

US 2007/0126101 A1   Jun. 7, 2007

(30) Foreign Application Priority Data

Dec. 5, 2005   (TW) .............. 94142759 A

(51) Int. Cl.
*G11C 5/00*   (2006.01)
(52) U.S. Cl. .................. 365/52; 235/492; 235/486; 235/487; 257/679; 361/736; 361/752; 361/758; 361/737; 361/748
(58) Field of Classification Search ............ 365/52; 235/492, 486, 487; 257/679; 361/736, 752, 361/758, 737, 748
See application file for complete search history.

(56) References Cited

U.S. PATENT DOCUMENTS

| | | | | |
|---|---|---|---|---|
| 5,285,057 A | * | 2/1994 | Murohara | ............... 235/492 |
| 5,742,844 A | * | 4/1998 | Feldman | ................... 712/32 |
| 6,021,048 A | * | 2/2000 | Smith | ..................... 361/736 |
| 6,038,132 A | * | 3/2000 | Tokunaga et al. | ......... 361/760 |
| 6,307,753 B1 | * | 10/2001 | Baginy et al. | ............. 361/796 |
| 6,536,670 B1 | * | 3/2003 | Postman et al. | ........... 235/487 |
| 2003/0193788 A1 | * | 10/2003 | Farnworth et al. | ......... 361/752 |

\* cited by examiner

*Primary Examiner*—Richard Elms
*Assistant Examiner*—Eric Wendler
(74) *Attorney, Agent, or Firm*—Rabin & Berdo, P.C.

(57) ABSTRACT

A memory card module includes a first circuit board, and a second circuit board. On one surface of the first circuit board, there are flash memories and a controller. The second circuit board is installed at one end of the first circuit board and is electrically connected with the first circuit board so as to form a transmitting interface port. On a first surface of the second circuit board, there are a plurality of interface connecting points. On a second surface of the second circuit board, part of the second surface is hollowed out. A space formed between the hollowed out area and the corresponding first circuit board increases the area for circuit layouts and the mounting components for the first circuit board. Therefore, quantity of accommodated memory components may be increased so as to increase the total storage capacity of the memory card under limitation of small dimensions.

5 Claims, 6 Drawing Sheets

MEMORY CARD MODULE

BACKGROUND OF THE INVENTION

1. Field of the Invention

The present invention relates to a memory card module. In particular, this invention relates to a memory card module that reduces the dimensions of a portable flash memory device and increases its storage capacity.

2. Description of the Related Art

Due to the rapidly development of semiconductor technology and the manufacturing technology for flash memory, the capacity and dimensions of portable storage mediums has gone through a period of great progress. Furthermore, because consumer electronic devices have digitized, such as digital still cameras, cell phones, DVs, digital MP3s etc, the demands for storing digital data have increased. Therefore, portable memory devices have become more popular.

Because portable flash memory device has to meet users' requirements of being easily carried around, its dimensions must be small while pertaining large capacity. With a pre-defined mechanical form-factor and dimensions, users are constantly demanding portable storage device with larger capacity to meet their application requirement. Storage capacity of a portable flash memory device may be increased by adopting memory chip with higher capacity or by adopting multiple memory chips. While maximum capacity of a single memory chip is limited by circuit design and fabrication process, physical dimensions and available space within the portable memory device restrain the quantity of memory chips that can be accommodated in a portable memory device. Technology such as present invention that allows accommodation of more memory components in limited space becomes very important to fulfill the contradictory requirements of smaller dimensions and larger storage capacity of portable memory device.

SUMMARY OF THE INVENTION

One particular aspect of the present invention is to provide a memory card module. The present invention increases the layout area and the quantity of accommodated memory components on the memory card module so that the memory card module increases its storage capacity in limited dimensions by increasing available circuit layout and component accommodation area.

The memory card module includes a first circuit board, and a second circuit board. On one surface of the first circuit board, there are flash memories and a controller. The second circuit board is installed at one end of the first circuit board and is electrically connected with the first circuit board so as to act as a transmitting interface port of the first circuit board. On a first surface of the second circuit board, there are a plurality of interface connecting points. On a second surface of the second circuit board, part of the second surface is hollowed out. A space formed between the hollowed out area and the corresponding first circuit board increases the circuit layout and component accommodation area of the first circuit board. Therefore, more circuit and memory components-may be accommodated so that the total storage capacity is increased under limited dimensions.

The transmitting interface port of the memory card module of the present invention can be a medium for connecting the flash memory located on the circuit board with an external device. Because there is a hollowed out area with a proper dimension on the corresponding surface between the transmitting interface port and the first circuit board, the area of the first circuit board corresponding to the hollowed out area can be used for increasing the circuit layout and the quantity of the component accommodation area. When the area is installed with memory, the storage capacity of the memory card module is increased. The space can also increase the layout area so that the dimensions of the memory card module are reduced.

Because the transmitting interface port of the first circuit board matches with SD memory card standard protocol, it can be installed to the shell body of an SD memory card. Alternatively, the transmitting interface port can implemented by combining a USB plugging head that is the same as the structure of the second circuit board with one end of the first circuit board. Therefore, the memory card module of the present invention can be applied to a variety of portable flash memory devices.

There are a plurality of soldering pads on the second surface of the second circuit board. The soldering pads individually correspond to the interface connecting points of the first surface. The soldering pads and its corresponding interface connecting points are connected to each other via a conducting means. The conducting means may be conducting through holes.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
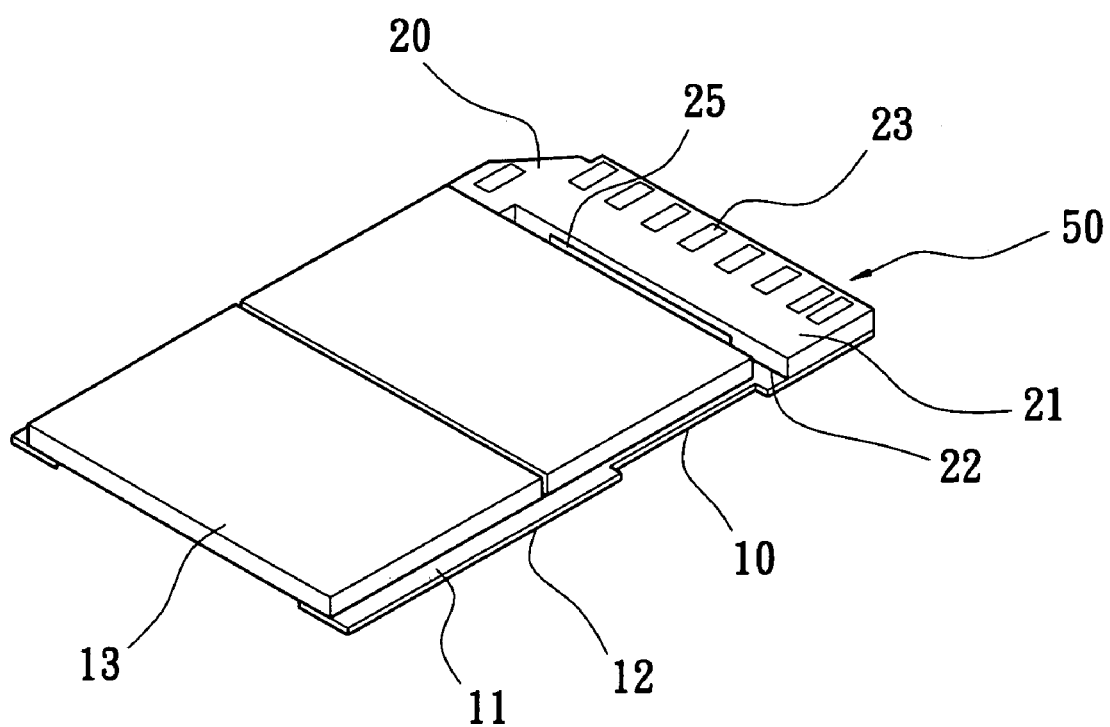
FIG. 1 is an assembly perspective view of the memory card module of the present invention.
Figure 2:
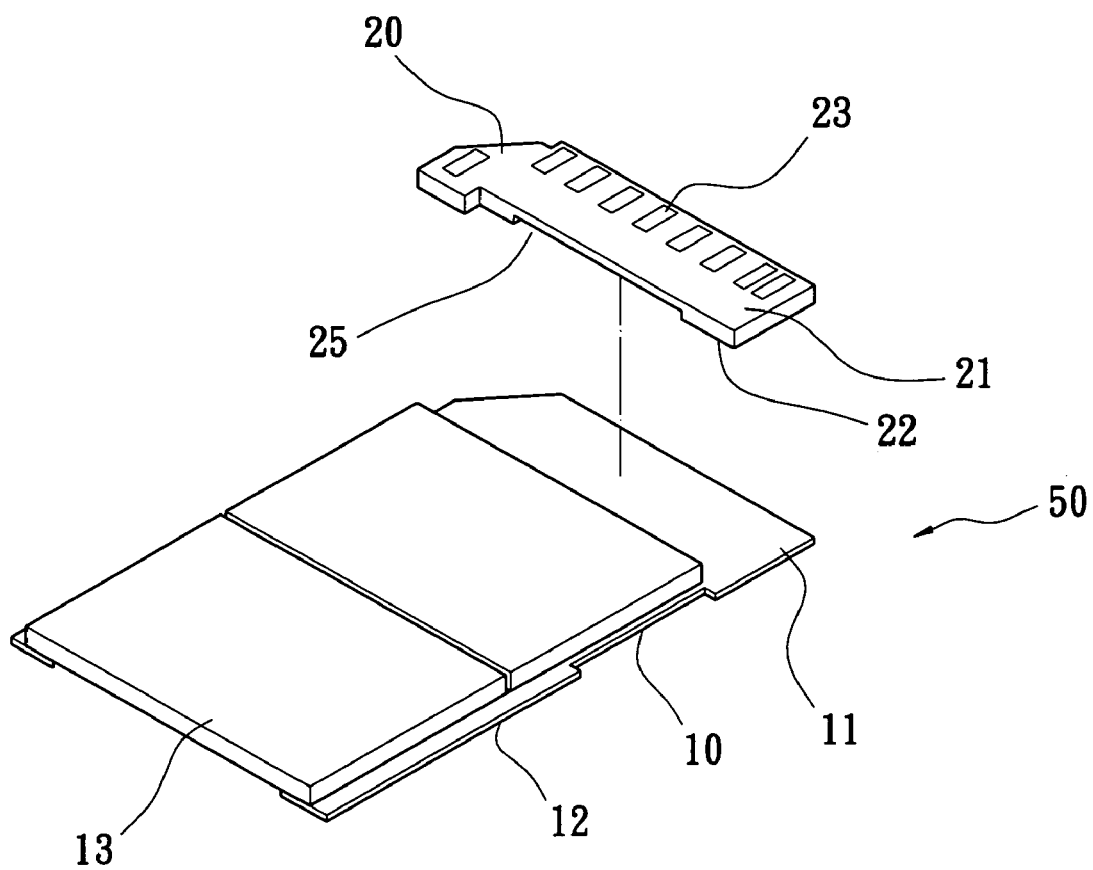
FIG. 2 is an exploded perspective view of the memory card module of the present invention.
Figure 3:
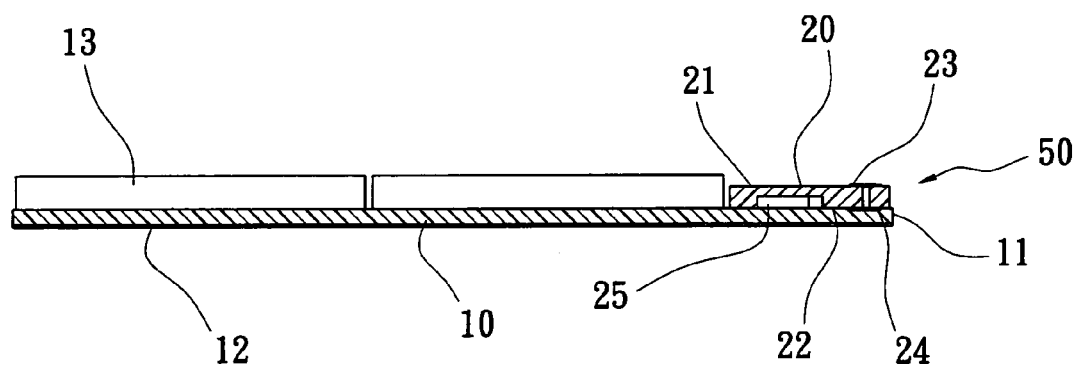
FIG. 3 is a cross-sectional view of the memory card module of the present invention.

Reference is made to FIGS. 1~3. The memory card module includes a first circuit board 10 and a second circuit board 20.

The first circuit board 10 has a first surface 11 and a corresponding second surface 12. On the first surface 11, there is at least one flash memory 13, a controller (not shown in the figure), and a transmitting interface port 50 mounted on it.

The second circuit board 20 has a first surface 21 and a corresponding second surface 22. On the first surface 21, there are a plurality of interface connecting points 23. On the outside end of the second surface 22, there are a plurality of soldering pads 24. The soldering pads 24 individually correspond to the interface connecting points 23 of the first surface 21, and conduct to each other and are electrically connected with the circuit on the first circuit board 10. Alternatively, the soldering pads 24 conduct the interface connecting points 23 via conducting holes. On the inside of the second surface 22 of the second circuit board 20, a hollowed out area 25 with a regular shape and an appropriate dimension and depth is formed.

As shown in FIGS. 1~3, when the first circuit board 10 is assembled with the second circuit board 20, the second surface 22 of the second circuit board 20 is installed with the first surface 11 located at one end of the first circuit board 10 to form the transmitting interface port 50. Because the hollowed out area 25 of the second circuit board 20 is implemented by partially hollowing out the second surface 22 of the second circuit board 20 and passing through the inside wall, the corresponding area of the first circuit board 10 beneath the second circuit board (that is originally covered by the second circuit board 20 and cannot dispose circuit and accommodate any component) can dispose electronic circuit and accommodate components via the design of partially hollowing the second surface 22 of the second circuit board 20. This means that the covered area that may not accommodate component is reduced (in size). Therefore, when the number of accommodated memory components on the first circuit board 10 is increased, the storage capacity of the memory module increases as well.

Figure 4:
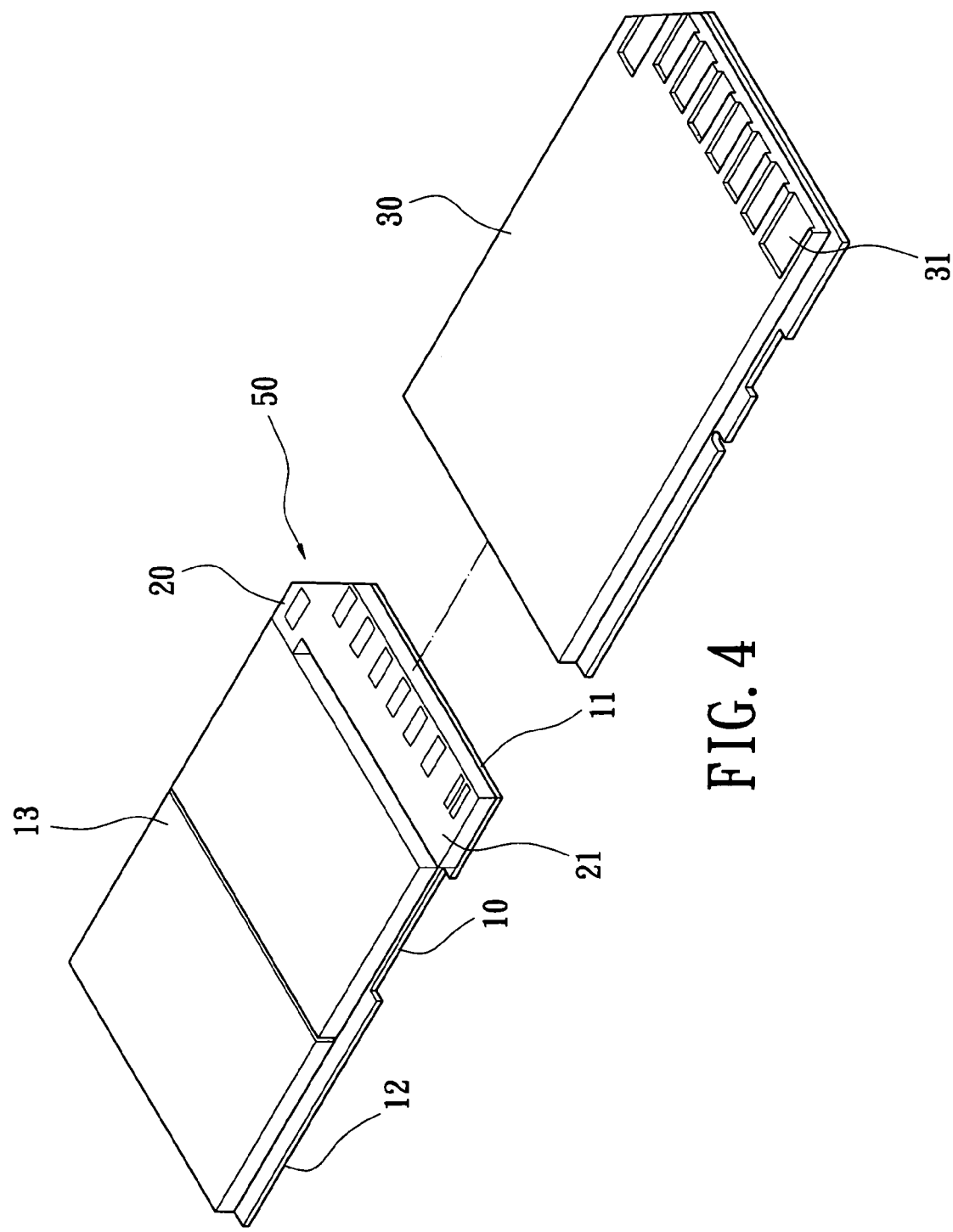
FIG. 4 is an exploded perspective view of the memory card module and an SD memory card shell of the present invention.
Figure 5:
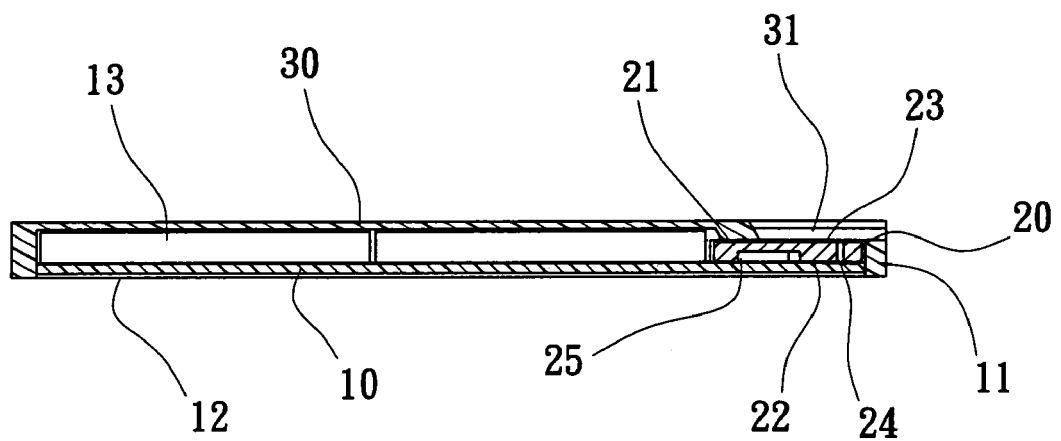
FIG. 5 is a cross-sectional view of the memory card module of the present invention plugged into SD memory card shell.

Reference is made to FIGS. 4 and 5. In this embodiment, the present invention uses TSOP and WSOP flash memory produced by SAMSUNG as an example. The thickness of the WSOP flash memory is 0.7 mm. When the depth of the hollowed out area 25 of the second surface 22 of the second circuit board 20 of the transmitting interface port 50 is larger than 0.7 mm, accommodation area for mounting WSOP flash memory is increased. When the depth of the hollowed out area 25 of the second surface 22 is larger than 1.2 mm, accommodation area for mounting TSOP flash memory is increased.

In one embodiment, the memory card module can be applied to an SD memory card, as shown in FIG. 4. The memory card module is packaged in a "one-time cover" shell 30. The shell 30 matches with the SD memory card standard format. At the front side of the shell 30, there are a plurality of openings 31. The shell 30 has an inverse-U shaped cross-section and a proper depth for receiving the memory card module.

The second surface 12 of the first circuit board 10 aligns to the bottom opening of the shell 30 and is combined together via a pasting method. The interface connecting points 23 located on the second circuit board 20 of the transmitting interface port 50 are individually located at the openings 31 formed at the corresponding locations of the shell 30. Therefore, the interface connecting points 23 is exposed between the openings 31 for connecting with external device.

Reference is made to FIG. 5. Because the second surface 12 of the first circuit board 10 of the memory card module approaches the bottom of the shell 30, there is a larger gap between the first surface 11 of the first circuit board and the inside wall of the shell 30. In this embodiment, the present invention uses the flash memory produced by SAMSUNG as an example. Because the accommodation area is enlarged, a large capacity TSOP flash memory with a thickness of 1.2 mm can be installed at one end of the first surface 11 of the first circuit board 10. Because the hollowed out area 25 is formed on the second surface of the second circuit board 20 located at another end of the first surface having the transmitting interface port 50, a space with a proper height is obtained for mounting memory or other components. When a WSOP flash memory with a 0.7 mm thickness is utilized, the storage capacity may be further increased. Furthermore, the memory card module can also be applied to other portable flash memory devices (such as portable disks, or thumb drives).

Figure 6:
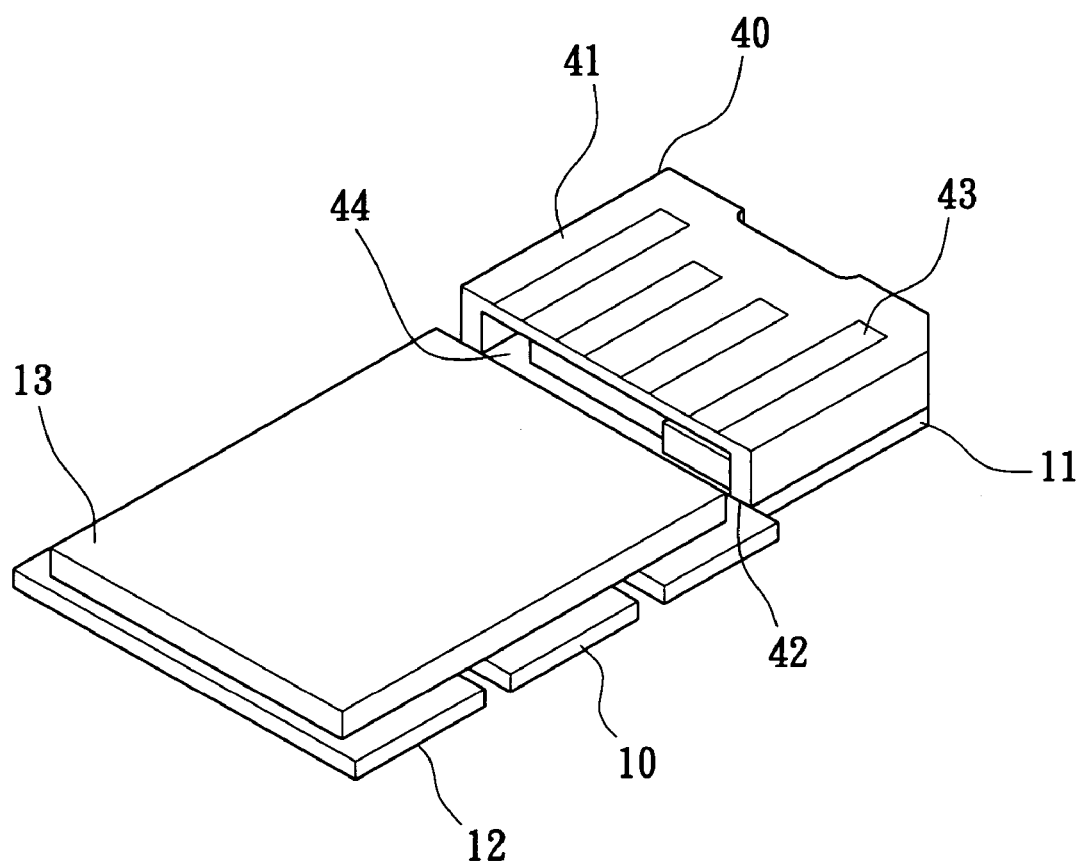
FIG. 6 is a perspective view of the transmitting interface port of the first circuit board of the memory card module of the present invention assembled with a USB plugging head.

Reference is made to FIGS. 3 and 6. When the memory card module is applied to the portable flash memory device, the basic structure is the same as the described one. At one end of the first surface 11 of the first circuit board 10, there is a flash memory 13, and a controller (not shown in the figure). Another end of the first surface 11 forms a transmitting interface port 50. In this embodiment, the second circuit board 20 is replaced by a USB plugging head 40 with the same structure that is assembled at one end of the first circuit board 10 to form the transmitting interface port 50. On the first surface of the USB plugging head 40, there are a plurality of conducting pins 43. On the second surface 42, there are soldering pads (not shown in the figure) for electrically connected with the conducting pins 43 and a hollowed out area 44. With the hollowed out area to accommodate additional memory or other components, the accommodation area on the first surface 11 of the first circuit board 10 is therefore increased.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. A memory card module, comprising:
   a first circuit board having a first surface and a corresponding second surface, wherein there is at least one flash memory and a controller on the first surface of the first circuit board,
   a second circuit board installed at one end of the first surface of the first circuit board that is electrically connected with a circuit located on the first circuit board so as to form a transmitting interface port of the first circuit board, wherein the second circuit board has a first surface and a corresponding second surface, there are a plurality of interface connecting points on the first surface and there is a hollowed out area with a proper depth on the second surface, a space formed by the hollowed out area and the corresponding first surface of the first circuit board increases the available area for circuit layout and mounting components.

2. The memory card module as claimed in claim 1, wherein the transmitting interface port is an SD memory card interface.

3. The memory card module as claimed in claim 1, wherein the transmitting interface port is a USB plugging head.

4. The memory card module as claimed in claim 1, wherein there are a plurality of soldering pads on the second surface of the second circuit board, each of the soldering pads individually corresponds to the interface connecting points located on the first surface of the second circuit board, and each of the soldering pads is connected with the corresponding interface connecting points via a conducting means.

5. The memory card module as claimed in claim 4, wherein the conducting means is at lease one conducting through hole.

* * * * *